(12) United States Patent
Yamasaki et al.

(10) Patent No.: US 10,985,305 B2
(45) Date of Patent: Apr. 20, 2021

(54) LIGHT EMITTING ELEMENT MOUNTING SUBSTRATE, LIGHT EMITTING DEVICE, AND LIGHT EMITTING MODULE

(71) Applicant: KYOCERA Corporation, Kyoto (JP)

(72) Inventors: Shou Yamasaki, Kyoto (JP); Mitsuharu Sakai, Kyoto (JP); Natsumi Ochi, Kyoto (JP); Yukio Morita, Kyoto (JP); Toshihiro Hashimoto, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 114 days.

(21) Appl. No.: 16/344,518

(22) PCT Filed: Oct. 25, 2017

(86) PCT No.: PCT/JP2017/038498
§ 371 (c)(1),
(2) Date: Apr. 24, 2019

(87) PCT Pub. No.: WO2018/079595
PCT Pub. Date: May 3, 2018

(65) Prior Publication Data
US 2019/0280179 A1    Sep. 12, 2019

(30) Foreign Application Priority Data
Oct. 25, 2016   (JP) .............................. JP2016-209100

(51) Int. Cl.
*H01L 33/64*    (2010.01)
*F28F 9/26*     (2006.01)
(Continued)

(52) U.S. Cl.
CPC .......... *H01L 33/642* (2013.01); *F21V 29/503* (2015.01); *F21V 29/76* (2015.01);
(Continued)

(58) Field of Classification Search
CPC ..... H01L 33/642; H01L 25/0753; F28F 9/266
See application file for complete search history.

(56) References Cited

U.S. PATENT DOCUMENTS

2011/0316035 A1    12/2011  Shin et al.
2012/0314369 A1    12/2012  Wu
(Continued)

FOREIGN PATENT DOCUMENTS

CN    103782404 A    5/2014
EP       2527729 A1   11/2012
(Continued)

*Primary Examiner* — Douglas M Menz
(74) *Attorney, Agent, or Firm* — Volpe Koenig

(57) ABSTRACT

A light emitting module and the like having a higher heat-dissipation effect includes a light emitting element mounting substrate, one or more light emitting elements, a heatsink including a through-hole in a position corresponding to a screw hole, a bolt screwed in the screw hole and fastening the heatsink and a metal plate or a full thread and a nut for the fastening. In the light emitting element mounting substrate, the metal plate, an insulating layer, and an electrode layer on which the one or more light emitting elements are mountable are stacked in this order. The metal plate includes a bottomed screw hole opened at a surface opposite to a surface in contact with the insulating layer. The bolt or the full thread and the nut have a heat conductivity equal to or greater than that of the metal plate.

11 Claims, 7 Drawing Sheets

(51) Int. Cl.
*H01L 25/075* (2006.01)
*F21V 29/89* (2015.01)
*F21V 29/503* (2015.01)
*F21V 29/76* (2015.01)

(52) U.S. Cl.
CPC .............. *F21V 29/89* (2015.01); *F28F 9/266* (2013.01); *H01L 25/0753* (2013.01); *H01L 33/64* (2013.01)

(56) References Cited

U.S. PATENT DOCUMENTS

| | | |
|---|---|---|
| 2013/0010481 A1 | 1/2013 | Qin |
| 2014/0225135 A1* | 8/2014 | Ahn ...................... H01L 33/648 257/88 |
| 2015/0338082 A1* | 11/2015 | Hu ....................... H05K 1/0204 362/373 |
| 2016/0190418 A1* | 6/2016 | Inomata ................ H01L 33/644 257/98 |

FOREIGN PATENT DOCUMENTS

| | | |
|---|---|---|
| JP | 2011-119582 A | 6/2011 |
| JP | 2011-166001 A | 8/2011 |
| JP | 2014-075429 A | 4/2014 |
| JP | 2014-120502 A | 6/2014 |
| JP | 2014-160756 A | 9/2014 |
| WO | 2014/061555 A1 | 4/2014 |

* cited by examiner

LIGHT EMITTING ELEMENT MOUNTING SUBSTRATE, LIGHT EMITTING DEVICE, AND LIGHT EMITTING MODULE

TECHNICAL FIELD

The present invention relates to a light emitting element mounting substrate, a light emitting device, and a light emitting module.

BACKGROUND ART

Recently, light emitting elements such as a light emitting diode (LED), which consume smaller power and have better visibility than conventional light sources, have been employed as light sources of various light emitting devices (for example, a headlamp of automobile).

The LED element has a characteristic of light emitting amount decreasing with an increase of temperature; thus, the increase of temperature has to be suppressed by taking measures to dissipate heat. In one of the measures taken typically, a substrate with the LED element mounted is fixed on a heatsink (also referred to as "heat-dissipation member" as well) to dissipate heat generated in the LED element to the heatsink. However, use of the heatsink alone is insufficient to obtain enough heat-dissipation effect. To address this, for example, PTL 1 describes a technique for improving the heat-dissipation effect by disposing a grease layer between the substrate and the heatsink. There are needs of a light emitting element mounting substrate, a light emitting device, and a light emitting module having an improved heat-dissipation effect.

CITATION LIST

Patent Literature

PTL 1: Japanese Unexamined Patent Application Publication No. 2014-120502

SUMMARY OF INVENTION

A light emitting element mounting substrate of the present disclosure includes a metal plate, an insulating layer, and an electrode layer on which one or more light emitting elements are mountable, stacked in this order. The metal plate includes a bottomed screw hole opened at a surface opposite to a surface in contact with the insulating layer.

A light emitting device of the present disclosure includes the light emitting element mounting substrate and one or more light emitting elements.

A light emitting module of the present disclosure includes the light emitting device, a heatsink including a through-hole in a position corresponding to the bottomed screw hole, and a bolt screwed in the bottomed screw hole and fastening the heatsink and the metal plate, or a full thread and a nut for the fastening. A heat conductivity of the bolt or the full thread and the nut is equal to or greater than a heat conductivity of the metal plate.

BRIEF DESCRIPTION OF DRAWINGS

An object, feature, and advantage of the present disclosure will be more apparent with reference to the following detailed descriptions and drawings.

DESCRIPTION OF EMBODIMENTS

Hereinafter, a light emitting element mounting substrate, a light emitting device, and a light emitting module according to the embodiments are described with reference to the accompanying drawings. In the following descriptions, top and bottom are differentiated by using words such as "top" or "on"; however, this is for convenience only and is not intended to restrict top and bottom in actually using the light emitting module and the like.

First Embodiment

Figure 1:
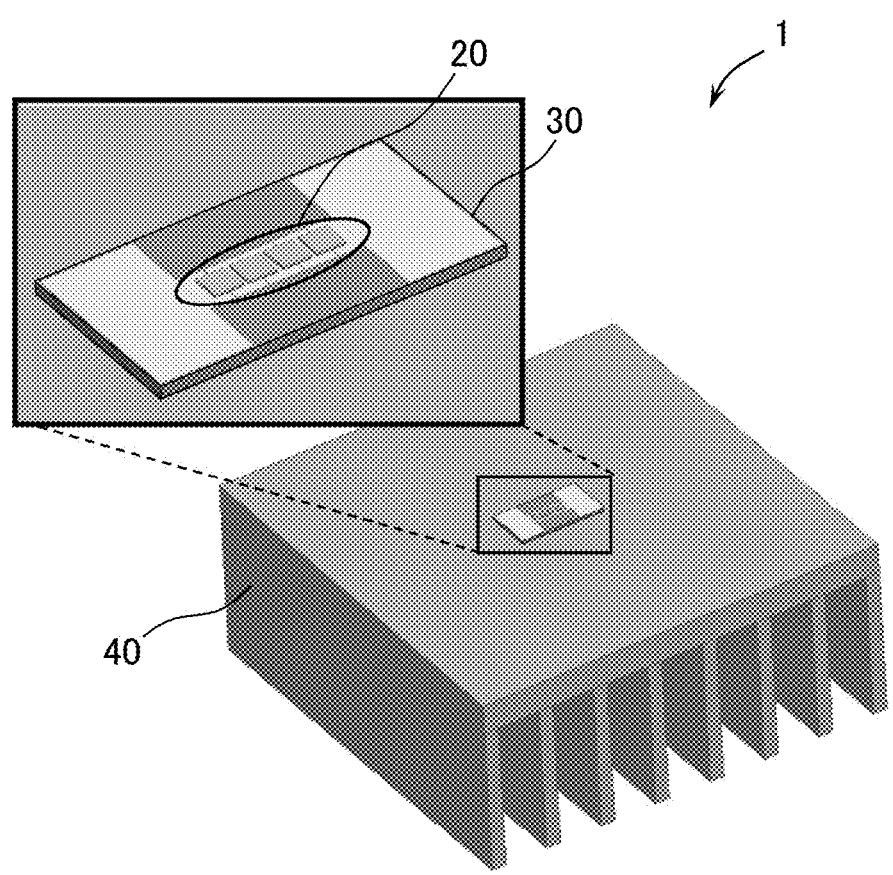
FIG. 1 is an external view schematically illustrating an example of a light emitting module according to a first embodiment.

FIG. 1 is an external view schematically illustrating an example of a light emitting module according to this embodiment. The light emitting module 1 illustrated in FIG. 1 is, for example, a member in a headlight of an automobile, in which a light emitting device 30 with a light emitting element 20 such as an LED mounted is disposed on a heatsink 40 for heat dissipation, and the heatsink 40 and the light emitting device are fixed to each other with a bolt or the like (not illustrated). The heatsink 40 is a typical heatsink, and the material thereof is, for example, aluminum. The light emitting device 30 has a flat plate shape with, for example, 2 mm in length×5 mm in width or 30 mm in length×40 mm in width and about 4 to 6 mm in thickness.

FIG. 1 illustrates an example of a light emitting module with four light emitting elements mounted; however, in this embodiment, the number of the light emitting elements is not limited to four, and one or more light emitting elements are mounted. Illustration of a power source, wiring, and the like of the light emitting module 1 is omitted in FIG. 1.

Figure 2A:
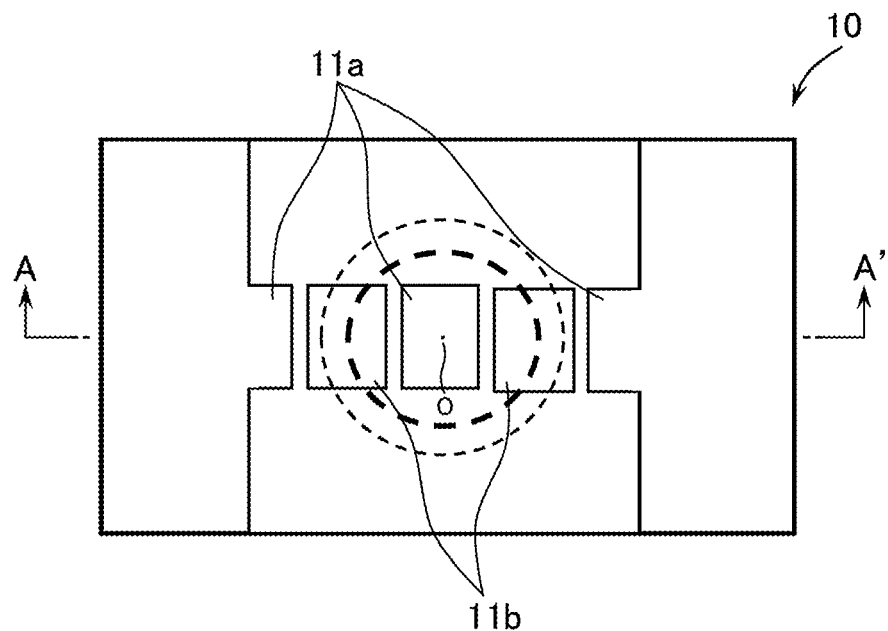
FIG. 2A is a plan view schematically illustrating an example of a light emitting element mounting substrate according to the first embodiment.
Figure 2B:
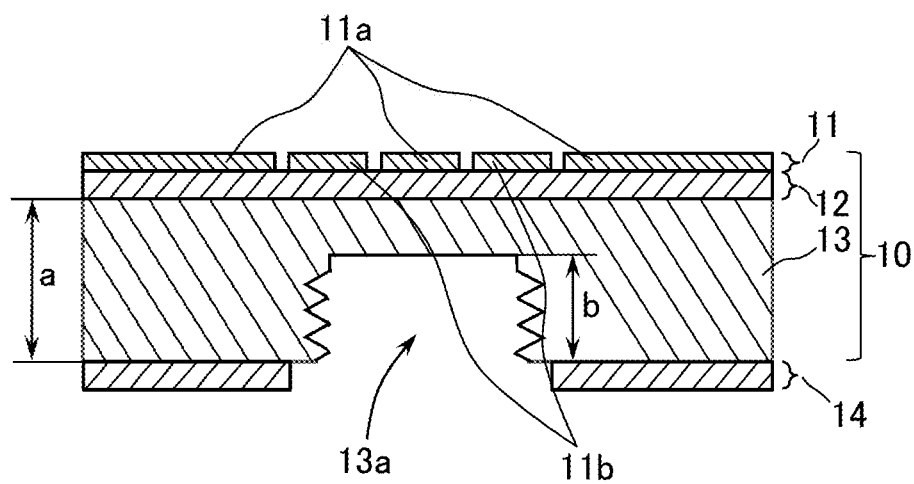
FIG. 2B is a sectional view taken along line A-A' of the light emitting element mounting substrate in FIG. 2A.

FIG. 2A is a plan view schematically illustrating an example of a light emitting element mounting substrate according to the first embodiment, and FIG. 2B is a sectional view taken along line A-A' of the light emitting element mounting substrate in FIG. 2A. As illustrated in FIG. 2B, a light emitting element mounting substrate 10 has a multilayer structure including an insulating layer 12 on a metal plate 13 and an electrode layer 11 on the insulating layer 12. A back side insulating layer 14 may be included under the metal plate 13.

The metal plate 13 is, for example, a copper plate with a thickness of 3 mm and 5 mm, inclusive, and includes a screw hole 13a with internal threads (for example, φ=3 mm) to be screwed with a later-described bolt (or full thread).

The insulating layer 12 is made of, for example, silicon nitride ($Si_3N_4$) with 0.1 mm in thickness or aluminum nitride (AlN) with 0.3 mm in thickness. The material of the insulating layer 12 may be aluminum nitride. The back side insulating layer 14 may be disposed for preventing warp of the substrate 10. The material and thickness of the back side insulating layer 14 may be the same as those of the insulating layer 12.

The electrode layer 11 includes a positive electrode 11a and a negative electrode 11b and is disposed with a pattern of copper or gold with, for example, 1 μm to 100 μm in thickness. The light emitting element is mounted on the electrode layer 11.

According to the light emitting element mounting substrate 10, it is possible to more reliably transfer heat generated in the light emitting element to the outside through the bolt or the like screwed in the screw hole 13a of the metal plate 13.

Figure 3A:
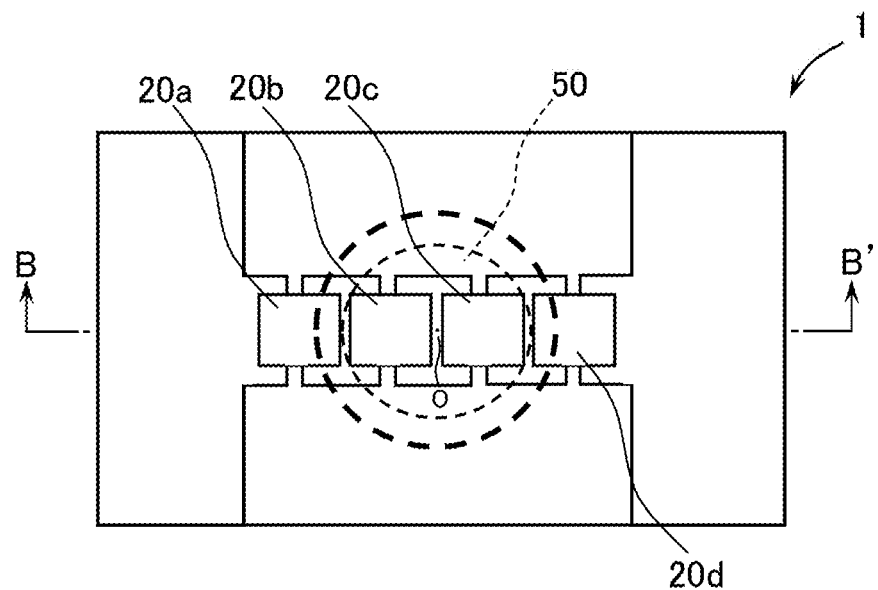
FIG. 3A is a plan view schematically illustrating an example of the light emitting module according to the first embodiment.
Figure 3B:
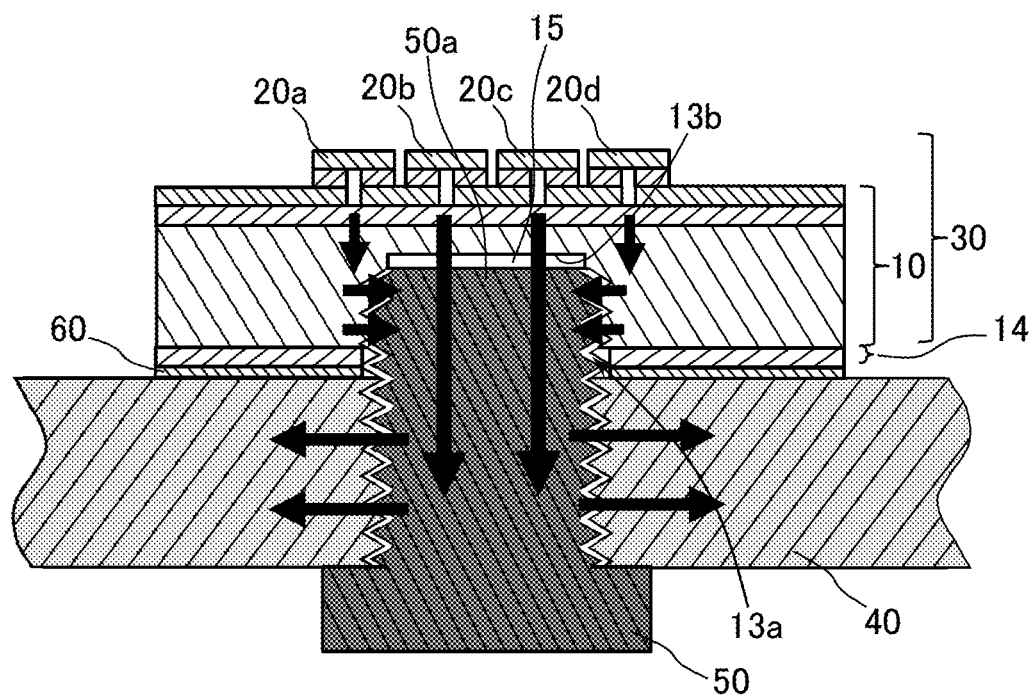
FIG. 3B is a sectional view taken along line B-B' of the light emitting module in FIG. 3A.

FIG. 3A is a plan view schematically illustrating an example of the light emitting module according to this embodiment, and FIG. 3B is a sectional view taken along line B-B' of the light emitting module in FIG. 3A. As illustrated in FIG. 3B, in the light emitting module 1, light emitting elements 20a to 20d are mounted on the light emitting element mounting substrate 10, and the light emitting element mounting substrate (more specifically, metal plate 13) and the heatsink 40 are fastened to each other by a bolt 50. A grease layer 60 may be included between the light emitting element mounting substrate 10 and the heatsink 40.

The member fastening the metal plate 13 and the heatsink 40 is not limited to the bolt and may be "a full thread and a nut" functioning like the bolt.

In a transparent plan view as illustrated in FIG. 3A, when the center of the region in which the multiple light emitting elements 20a to 20d are mounted in the electrode layer 11 and the center of the bolt 50 coincide with each other, a light emitting module with an improved heat-dissipation effect is achieved with a balanced heat-dissipation.

As indicated by arrows in FIG. 3B, heat generated in the light emitting elements 20a to 20d passes through the electrode layer 11, the insulating layer 12, the metal plate 13, and the bolt 50 to be transferred to the heatsink 40. When the heat conductivity of the metal plate 13 and the heat conductivity of the bolt 50 (or the full thread and the nut) are equal to each other, or when the heat conductivity of the metal plate 13 is smaller than the heat conductivity of the bolt 50, high heat-dissipation effect is realized. In the above-described example, the material of both the metal plate 13 and the bolt 50 (or the full thread and the nut) may be copper.

A depth b of the screw hole 13a and a thickness a of the metal plate 13 illustrated in FIG. 2B may have the following relationships:

$$0.3a \leq b \leq 0.9a \quad (1); \text{ and}$$

$$0.5a \leq b \leq 0.9a \quad (2).$$

The above relationships may be determined based on the balance between the heat-dissipation efficiency and the intensity of the metal plate (consequently the intensity of the light emitting element mounting substrate).

With the above-described light emitting module configuration, it is possible to more reliably transfer heat generated in the light emitting element to the heatsink through the metal plate and bolt.

Second Embodiment

In the light emitting module 1 according to the first embodiment, a gap of an air layer (hereinafter referred to as "gap") 15 is formed between a tip end of the bolt 50 screwed in the screw hole 13a of the metal plate 13 and a deepest portion 13b of the screw hole 13a (hereinafter referred to as "deepest portion of screw hole") facing the tip end of the bolt 50, and the heat-dissipation effect is reduced in this portion. Thus, in a second embodiment, a metal joint is disposed in the gap 15 to suppress reduction of the heat-dissipation effect in the gap 15.

Figure 4A:
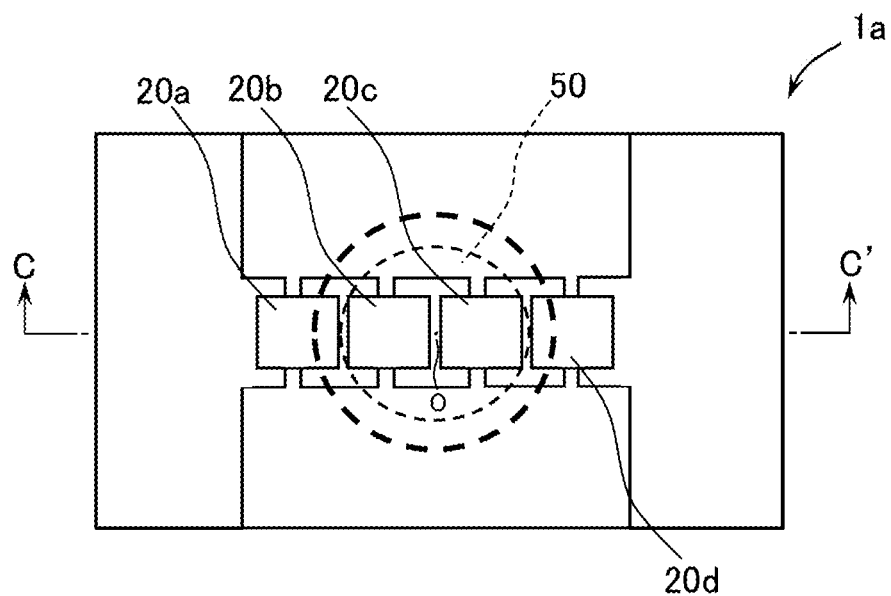
FIG. 4A is a plan view schematically illustrating an example of a light emitting module according to a second embodiment.
Figure 4B:
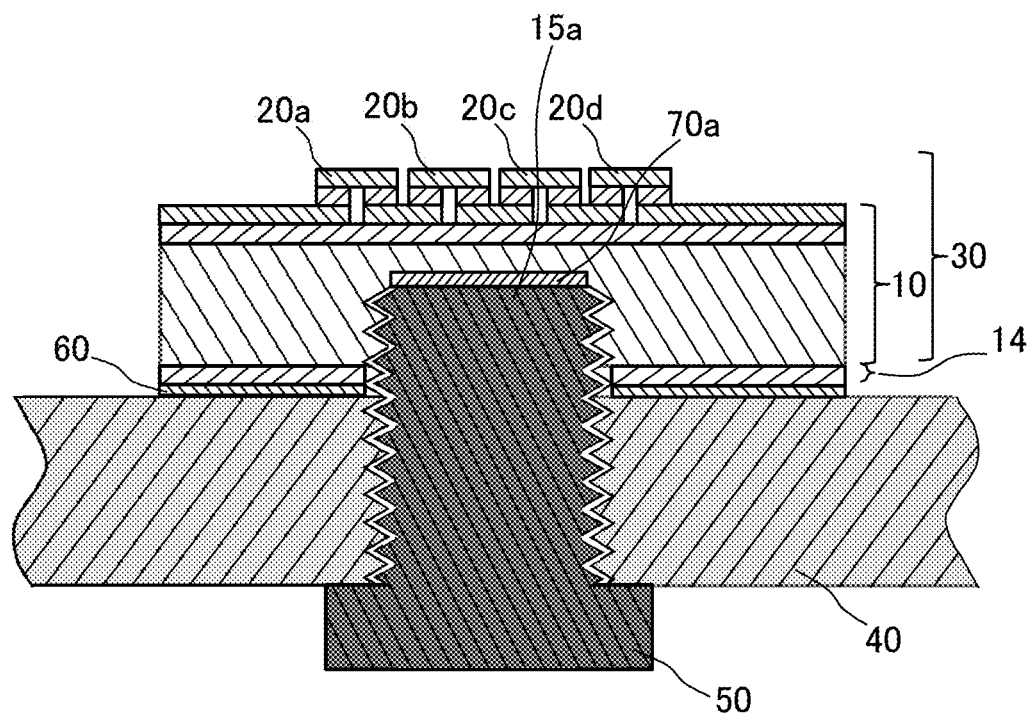
FIG. 4B is a sectional view taken along line C-C' of the light emitting module in FIG. 4A.

FIG. 4A is a plan view schematically illustrating a light emitting module according to the second embodiment, and FIG. 4B is a sectional view taken along line C-C' of the light emitting module in FIG. 4A.

As illustrated in FIG. 4B, a metal joint 70a is disposed in the gap 15 formed by the deepest portion 13b of the metal plate 13 and a tip end 50a of the bolt 50.

The metal joint 70a may have (A) a hardness less than a hardness of the metal plate 13, or (B) a heat conductivity equal to or greater than a heat conductivity of the metal plate 13. There may be disposed a metal joint having (C) a hardness less than a hardness of the metal plate 13 and a heat conductivity equal to or greater than a heat conductivity of the metal plate 13.

Specifically, for example, according to the values in Table 1, when the material of the metal plate 13 is copper, the material of the metal joint 70a may be silver, gold, aluminum, solder, or the like for the example of (A). The material of the metal joint 70a may be silver or the like for the example of (B). The material of the metal joint 70a may be silver or the like for the example of (C). Thus, when the material of the metal plate 13 is copper, the material of the metal joint 70a may be silver.

As described above, since the reduction of the heat-dissipation effect in the gap 15 is suppressed by disposing the metal joint 70a in the gap 15, it is possible to reliably transfer the heat generated in the light emitting elements 20a to 20d to the bolt 50 and the like through the metal plate 13.

TABLE 1

| | hardness (Hv) | heat conductivity [W/mK] |
| --- | --- | --- |
| copper | 46 | 372 |
| gold | 26 | 295 |
| silver | 26 | 418 |
| aluminum | 25 | 204 |
| solder (50Sn) | 20 | 49 |

Third Embodiment

Figure 5A:
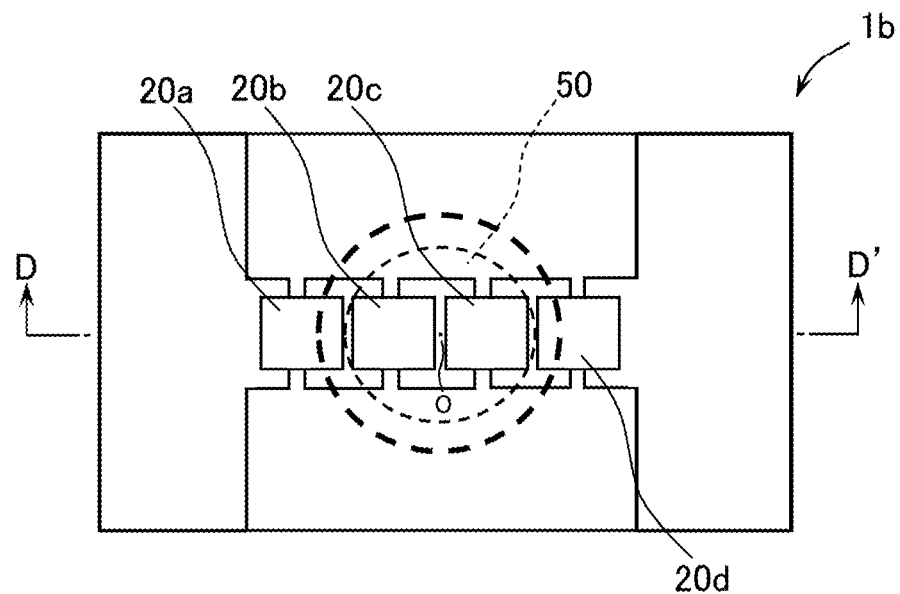
FIG. 5A is a plan view schematically illustrating an example of a light emitting module according to a third embodiment.

This embodiment presents an example in which the same object as the second embodiment is achieved while a metal joint is disposed differently from the second embodiment. FIG. 5A is a plan view schematically illustrating a light emitting module according to this embodiment, and FIG. 5B is a sectional view taken along line D-D' of the light emitting module in FIG. 5A.

Figure 5B:
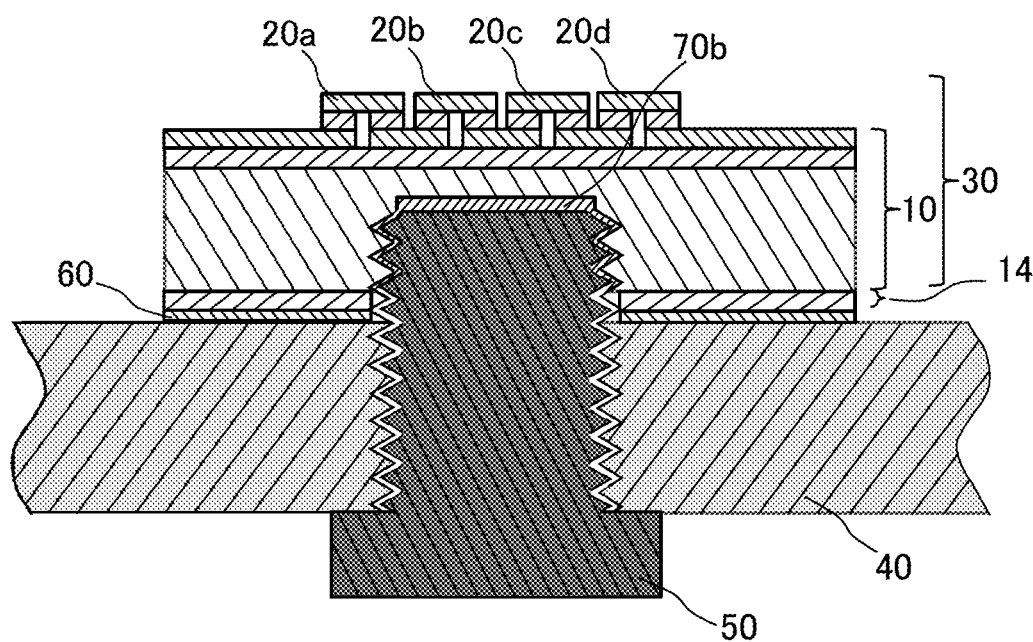
FIG. 5B is a sectional view taken along line D-D' of the light emitting module in FIG. 5A.

As illustrated in FIG. 5B, a metal joint 70*b* is disposed over an inner surface of the screw hole 13*a* of the metal plate 13 so as to surround the external thread of the bolt 50. The metal joint 70*b* is disposed to surround the entire inner surface of the screw hole 13*a* of the metal plate 13, and the gap 15 formed by the screw hole 13*a* of the metal plate 13 and the external thread of the bolt 50 is filled with the metal joint 70*b*. Accordingly, the heat generated in the light emitting elements 20*a* to 20*d* is reliably transferred to the bolt 50 through the metal plate 13. The material of the metal joint 70*b* in this embodiment may be determined similarly to determining the material of the metal joint 70*a* in the second embodiment.

Fourth Embodiment

Figure 6A:
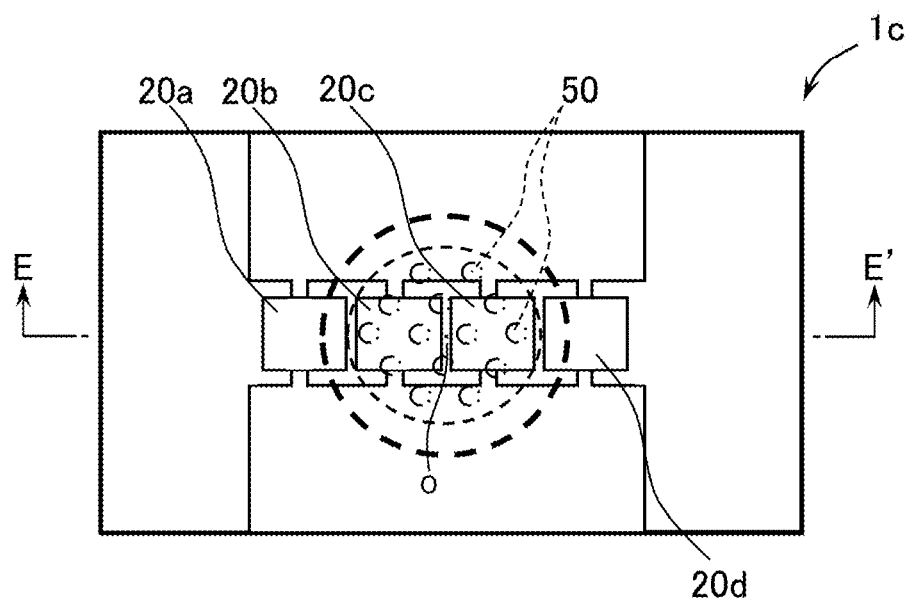
FIG. 6A is a plan view schematically illustrating an example of a light emitting module according to a fourth embodiment.

This embodiment presents an example in which a metal joint is disposed to improve the heat-dissipation effect compared to the metal joint in the second embodiment. FIG. 6A is a plan view schematically illustrating a light emitting module according to a fourth embodiment, and FIG. 6B is a sectional view taken along line E-E' of the light emitting module in FIG. 6A.

Figure 6B:
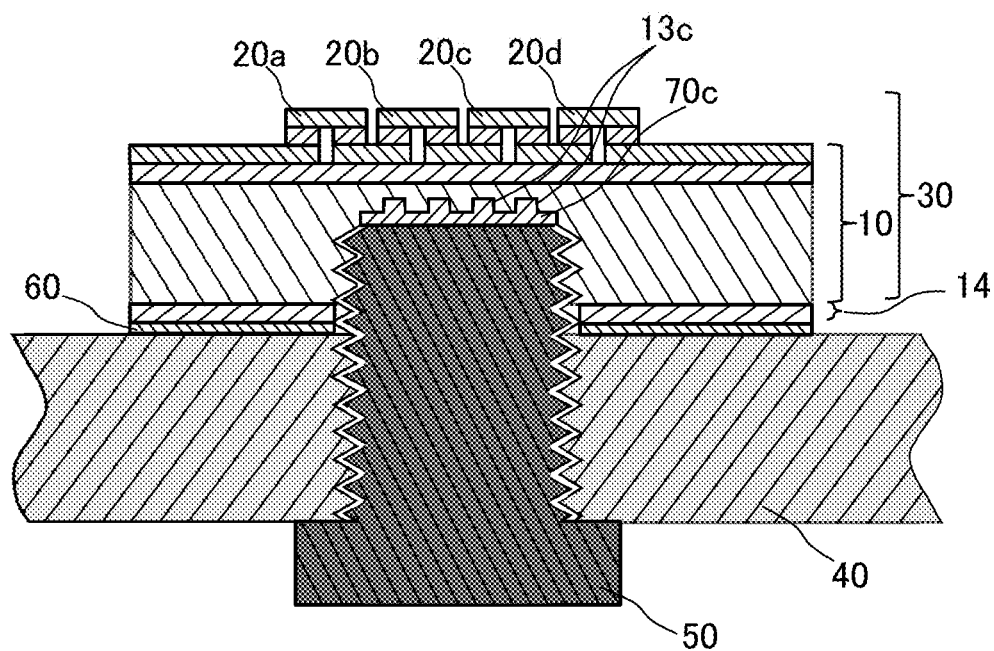
FIG. 6B is a sectional view taken along line E-E' of the light emitting module in FIG. 6A.

As illustrated in FIG. 6B, small holes 13*c* are formed in portions deeper than the deepest portion 13*b* of the metal plate 13, and these small holes 13*c* are filled with a metal joint 70*c* to increase the surface area in which the metal plate 13 and the metal joint contact with each other. Accordingly, the heat generated in the light emitting elements 20*a* to 20*d* is more reliably transferred to the bolt 50 through the metal plate 13. The material of the metal joint 70*c* in this embodiment may be determined similarly to determining the material of the metal joint 70*a* in the second embodiment.

Fifth Embodiment

Figure 7:
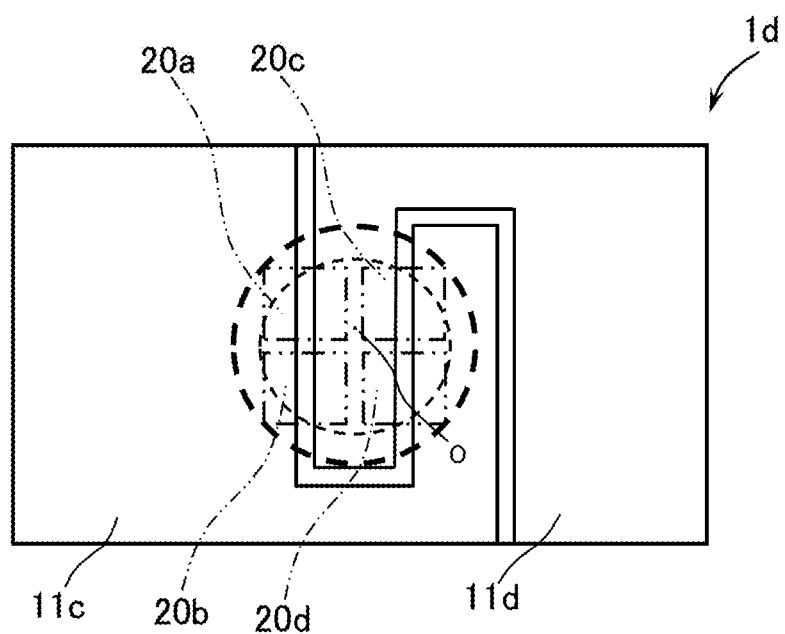
FIG. 7 is a plan view schematically illustrating an example of a light emitting module according to a fifth embodiment.

FIG. 7 is a plan view schematically illustrating a light emitting element mounted according to this embodiment. As illustrated in FIG. 7, the multiple light emitting elements 20*a* to 20*d* may be disposed in a grid pattern on the electrode layer including a positive electrode 11*c* and a negative electrode 11*d*. In this embodiment also, in the transparent plan view, the center of the region in which the multiple light emitting elements 20*a* to 20*d* are mounted in the electrode layer 11 and the center of the bolt 50 coincide with each other. Accordingly, a light emitting module with an improved heat-dissipation effect is achieved with a balanced heat dissipation.

The present disclosure can be implemented in other various aspects without departing from its sprit or the main feature. Thus, the above-described embodiments are merely examples at all respects, and the scope of the present disclosure is described in the claims and is never limited by the descriptions in the specification. All modifications and variations depending from the scope of claims are within the scope of the present disclosure.

REFERENCE SIGNS LIST

1, 1*a*, 1*b*, 1*c*, 1*d* light emitting module
10 light emitting element mounting substrate
11 electrode layer
11*a*, 11*c* positive electrode
11*b*, 11*d* negative electrode
12 insulating layer
13 metal plate
13*a* screw hole
13*b* deepest portion
13*c* small hole
14 back side insulating layer
15 gap
20 light emitting element
20*a*, 20*b*, 20*c*, 20*d* light emitting element
30 light emitting device
40 heatsink
50 bolt
50*a* tip end of bolt 50
60 grease layer
70*a*, 70*b*, 70*c* metal joint

The invention claimed is:

1. A light emitting element mounting substrate, comprising:
    a metal plate;
    an insulating layer; and
    an electrode layer on which one or more light emitting elements are mountable, the metal plate, the insulating layer, and the electrode layer being stacked in this order, wherein
        the metal plate comprises a bottomed screw hole opened at a surface opposite to a surface in contact with the insulating layer, and
        a metal joint is disposed in a deepest portion of the bottomed screw hole of the metal plate, the metal joint having a hardness less than a hardness of the metal plate and/or a heat conductivity equal to or greater than a heat conductivity of the metal plate.

2. The light emitting element mounting substrate according to claim 1, wherein
    in a transparent plan view, a region in which the one or more light emitting elements are mountable in the electrode layer at least partially overlaps with the bottomed screw hole of the metal plate.

3. The light emitting element mounting substrate according to claim 1, wherein in a transparent plan view, a center of a region in which the one or more light emitting elements are mountable in the electrode layer coincides with a center of the bottomed screw hole of the metal plate.

4. The light emitting element mounting substrate according to claim 1, wherein
    a material of the metal joint is solder, gold, silver, or aluminum.

5. The light emitting element mounting substrate according to claim 4, wherein
    the metal joint is disposed over an entire inner surface of the bottomed screw hole.

6. The light emitting element mounting substrate according to claim 4, wherein
    the metal plate comprises a small hole in a portion deeper than the deepest portion, and
    the small hole is filled with the metal joint.

7. The light emitting element mounting substrate according to claim 1, wherein
    a depth of the bottomed screw hole is 50% to 90%, inclusive, of a thickness of the metal plate.

8. A light emitting device, comprising:
    the light emitting element mounting substrate according to claim 1; and
    one or more light emitting elements.

9. A light emitting module, comprising:
the light emitting device according to claim 8;
a heatsink comprising a through-hole in a position corresponding to the bottomed screw hole; and
a bolt screwed in the bottomed screw hole and fastening the heatsink and the metal plate, or a full thread and a nut screwed in the bottomed screw hole fastening the heatsink and the metal plate, wherein
a heat conductivity of the bolt or the full thread and the nut is equal to or greater than a heat conductivity of the metal plate.

10. The light emitting module according to claim 9, further comprising:
a back side insulating layer between the metal plate and the heatsink, the back side insulating layer comprising a through-hole in a position corresponding to the bottomed screw hole.

11. The light emitting module according to claim 10, wherein
a material of the metal plate and the bolt or the full thread and the nut is copper,
a material of the metal joint is silver, and
a material of the back side insulating layer is $Si_3N_4$ or AlN.

\* \* \* \* \*